(12) United States Patent
De-Michielis et al.

(10) Patent No.: US 11,075,285 B2
(45) Date of Patent: Jul. 27, 2021

(54) INSULATED GATE POWER SEMICONDUCTOR DEVICE AND METHOD FOR MANUFACTURING SUCH A DEVICE

(71) Applicant: ABB Power Grids Switzerland AG, Baden (CH)

(72) Inventors: Luca De-Michielis, Aarau (CH); Chiara Corvasce, Bergdietikon (CH)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 0 days.

(21) Appl. No.: 16/157,435

(22) Filed: Oct. 11, 2018

(65) Prior Publication Data

US 2019/0123172 A1 Apr. 25, 2019

Related U.S. Application Data

(63) Continuation of application No. PCT/EP2017/058697, filed on Apr. 11, 2017.

(30) Foreign Application Priority Data

Apr. 11, 2016 (EP) ..................................... 16164709

(51) Int. Cl.
*H01L 29/66* (2006.01)
*H01L 29/739* (2006.01)
(Continued)

(52) U.S. Cl.
CPC .... *H01L 29/66734* (2013.01); *H01L 29/0619* (2013.01); *H01L 29/0623* (2013.01);
(Continued)

(58) Field of Classification Search
None
See application file for complete search history.

(56) References Cited

U.S. PATENT DOCUMENTS 5,471,075 A 11/1995 Shekar et al.
8,304,305 B2 11/2012 Chiola et al.
(Continued)

FOREIGN PATENT DOCUMENTS

CN 101246900 A 8/2008
CN 101401212 A 4/2009
(Continued)

OTHER PUBLICATIONS

European Patent Office, International Search Report & Written Opinion issued in corresponding Application No. PCT/EP2017/058697 dated Jun. 20, 2017, 17 pp.
(Continued)

*Primary Examiner* — Shaun M Campbell
*Assistant Examiner* — Aneta B Cieslewicz
(74) *Attorney, Agent, or Firm* — Slater Matsil, LLP

(57) ABSTRACT

An insulated gate power semiconductor device includes an (n-) doped drift layer between an emitter side and a collector side. A p doped protection pillow covers a trench bottom of a trench gate electrode. An n doped enhancement layer having a maximum enhancement layer doping concentration in an enhancement layer depth separates the base layer from the drift layer. An n doped plasma enhancement layer having a maximum plasma enhancement layer doping concentration covers an edge region between the protection pillow and the trench gate electrode. The N doping concentration decreases from the maximum enhancement layer doping concentration towards the plasma enhancement layer and the N doping concentration decreases from the maximum plasma enhancement layer doping concentration towards the enhancement layer such that the N doping concentration has a local doping concentration minimum between the enhancement layer and the plasma enhancement layer.

20 Claims, 10 Drawing Sheets

(51) Int. Cl.
*H01L 29/06* (2006.01)
*H01L 29/10* (2006.01)
*H01L 29/78* (2006.01)
*H01L 21/225* (2006.01)
*H01L 21/265* (2006.01)
*H01L 29/08* (2006.01)
*H01L 21/266* (2006.01)

(52) U.S. Cl.
CPC ........ *H01L 29/0834* (2013.01); *H01L 29/10* (2013.01); *H01L 29/66348* (2013.01); *H01L 29/7397* (2013.01); *H01L 29/7813* (2013.01); *H01L 21/2253* (2013.01); *H01L 21/266* (2013.01); *H01L 21/26513* (2013.01)

(56) References Cited

U.S. PATENT DOCUMENTS

| | | |
|---|---|---|
| 2011/0233728 A1 | 9/2011 | Chiola et al. |
| 2014/0264564 A1 | 9/2014 | Cheng et al. |
| 2015/0024556 A1* | 1/2015 | Miyazaki ......... H01L 21/26513 438/138 |

FOREIGN PATENT DOCUMENTS

| | | |
|---|---|---|
| CN | 102969350 A | 3/2013 |
| CN | 103959475 A | 7/2014 |
| CN | 105321998 A | 2/2016 |
| EP | 0795911 A2 | 9/1997 |
| EP | 2602826 A1 | 6/2016 |
| JP | 2007129097 A | 5/2007 |
| JP | 2010219361 A | 9/2010 |
| JP | 2010232627 A | 10/2010 |
| JP | 5707681 B2 | 4/2015 |
| WO | 2016120053 A1 | 8/2016 |

OTHER PUBLICATIONS

European Patent Office, Extended Search Report issued in corresponding Application No. 16164709.4, dated Oct. 17, 2016, 11 pp.
Hwang et al., "Use of the p-floating shielding layer for improving electric field concentration of the recessed gate," Integrated Circuit Design and Technology International Conference, IEEE, Piscataway, New Jersey, Jun. 2, 2008, 4 pp.

* cited by examiner

INSULATED GATE POWER SEMICONDUCTOR DEVICE AND METHOD FOR MANUFACTURING SUCH A DEVICE

TECHNICAL FIELD

The invention relates to the field of power electronics, and more particularly to a device as such according to the preamble of the independent claim 1 or to a method for manufacturing an insulated gate power semiconductor device according to the independent claim 12.

BACKGROUND ART

In FIG. 18 a prior art insulated gate bipolar transistor (IGBT) is shown as known from EP 0 795 911 A2. The prior art device comprises an active cell with layers of different conductivity types in the following order between an emitter electrode 2 on an emitter side 22 and a collector electrode 25 on a collector side 27 opposite to the emitter side 22: an (n+) doped source layer 3, a p doped base layer 4, which contacts the emitter electrode 2, an n doped enhancement layer 95, an (n−) doped drift layer 5, an (n+) doped buffer layer 55 and a p doped collector layer 6.

A trench gate electrode 7 is arranged on the emitter side 22, which comprises a gate layer 70 and a first electrically insulating layer 72, which surrounds and thus separates the gate layer 70 from the drift layer 5, base layer 4 and the source layer 3. A second insulating layer 74 is arranged between the gate layer 70 and the emitter electrode 2. The trench gate electrode 7 extends from the emitter side 22 up to a trench depth 77, at which the trench gate electrode 7 has a trench bottom 76. The trench gate electrode 7 has trench lateral sides 75 extending from the trench bottom 76 to the emitter side 22. A p doped protection pillow 8 covers the trench bottom 76.

As described in EP 0 795 911 A2 the prior art device is created by first implanting and diffusing an N-dopant for the creation of the enhancement layer 95. The enhancement layer 95 has a higher doping concentration than the drift layer 5. Afterwards, a P-dopant is implanted and diffused for creating the p doped base layer 4. The n+ source layer 3 is then created by implanting and diffusing an N-dopant using a resist mask. Subsequently, an oxide film is applied over the source layer 3 and partly over the base layer 4 for etching openings for the trench gate electrodes 7, which extend in depth direction down to the drift layer 5. Now a P dopant is implanted in the bottom of the trench. Then the oxide film is etched away and a thermal oxide film (for forming the first insulating layer 72) is formed on the surface of the trenches, which are then filled with polysilicon doped with N-impurities for creating an electrically conductive gate layer 70. The polysilicon is etched back to the openings of the trenches, leaving the polysilicon buried in the trenches. Then the surface is covered by a second insulating layer 74, which is afterwards covered by a resist layer as another mask, which covers the regions on top of the trenches, the source regions 3 besides a small open area, which lies directly adjacent to the base layer, 4 which is also uncovered. The second insulating layer 74 is then etched away at the uncovered resist mask areas, thus maintaining the second insulating layer 74 on top of the gate layer 70 and the adjacent part of the source layer 3. Afterwards AlSi is applied on the uncovered areas of the second insulating layer 74, by which AlSi layer, which forms the emitter electrode 2, the base layer 4 and source layer 3 are shorted.

The n-type enhancement layer 95 improves the PIN effect, increases the plasma concentration and lowers the on-state losses. However, such a prior art device having a highly doped enhancement layer 95 will suffer from worse SOA and breakdown voltage compared to standard trench IGBTs. As the carrier concentration near the active cell is enhanced by such an enhancement layer 95, IGBTs with such an enhancement layer 95 are superior compared to prior art IGBTs having no enhancement layer in view of higher safe operating area (SOA) and lower on-state losses.

However, the electric field at the n-enhancement layer 95/p-base layer 4 junction also increases. Practical enhancement layer doping concentrations are therefore limited to values smaller than $2.5*10^{16}$ cm$^{-3}$ to prevent excessive electric fields and therefore degradation of the blocking performance and turn-off SOA. As shown in FIG. 19, the on-state voltage $V_{CE,on}$ advantageously decreases for higher doping concentrations. That means for the breakdown voltage, the lower the doping concentration of the enhancement layer the better, and for the on-state voltage vice versa with an upper limit of the doping concentration at the point at which the breakdown voltage collapses.

The enhancement layer 95 allows for a remarkable reduction of the on-state ($V_{CE,on}$) and its benefits are even more important for larger doping concentrations of the enhancement layer 95 ($N_{D,enh}$). However, the larger the enhancement doping concentration is, the lower is the breakdown voltage ($V_{BD}$) that the IGBT is able to sustain.

FIG. 20 shows data for different prior art devices. Device 1 is a trench IGBT having a maximum doping concentration in the enhancement layer 95 of $2*10^{16}$ cm$^3$ and no protection pillow. Device 2 differs from device 1 by having a first p doped protection pillow 8. Device 3 is a trench IGBT having a maximum doping concentration in the enhancement layer 95 of $1*10^{17}$ cm$^3$ and no protection pillow, and device 4 differs from device 3 by having a first p doped protection pillow 8.

The impact ionization effect, responsible for the detrimental degradation of the IGBT devices, is typically taking place at the trench bottom. However, in a device with an increased enhancement doping concentration (larger than $2.5*10^{16}$ cm$^{-3}$) the avalanche generation takes place at the interface between the p-base layer 4 and the n-enhancement layer 95. In order to be able of exploiting the on-state benefits of a highly doped enhancement layer 95, without suffering from the drawbacks of reduced reverse blocking safe operating area (RBSOA) capabilities, a first p doped protection pillow 8 has been introduced in EP 0 795 911 A2. The protection pillow 8 reduces the high electric field at the trench bottom, which have been created due to the introduction of the enhancement layer 95, so that the RBSOA and breakdown voltage $V_{BD}$ is improved. This is shown in FIG. 20, in which both devices having a protection pillow 8 have an improved $V_{BD}$, but worser $V_{CE,on}$. Nevertheless, the introduction of p doped protection pillows 8 at the trench bottoms 76 improves the device robustness, being able to postpone the onset of the breakdown mechanism, but is not able to redeem the inherent weakness of a trench IGBT device sufficiently where the impact ionization is caused by increased enhancement doping concentration.

This is the case, because for devices with larger enhancement doping concentration levels, when the breakdown conditions are fulfilled the avalanche generation still takes place at the n-enhancement layer/p-base layer boundary, with a relevant amount of generated carriers near the Silicon/gate oxide (first insulating layer 72) interface. This potentially translates in unwanted drawbacks such as hot carrier injection in the gate oxide with consequent threshold voltage instabilities. Eventually, this device also shows a degraded dynamic avalanche robustness, and this phenomena is even more exacerbated under hard switching conditions.

In a prior art trench IGBT with enhancement layer, the enhancement layer may lead to premature device failure (breakdown). This effect is increased for higher doping concentration of the enhancement layer or greater thickness of the enhancement layer. Such premature device breakdown may be reduced if such a thick enhancement layer is horizontally layered with layers of opposite dopant type, in which the electric field is released (EP 2 602 826 A1). Such layers of opposite dopant type are provided in areas where the electric field can be relaxed. However, such layered structures are laborious to form.

Introduction of a protection pillow 8 to a prior art device having an enhancement layer of increased maximum doping concentration (i.e. above 2.5 or $3*10^{16}$ cm$^{-3}$) leads to a great improve on the breakdown voltage, but still this values stays much lower than for a device without protection pillow and lower enhancement doping concentration (i.e. below $2.5*10^{16}$ cm$^{-3}$).

The p protection pillow improves the breakdown robustness at the price of an increased on-state. However the weakness of avalanche generation at the enhancement/channel interface is present in the prior art device 4 (FIG. 20) with increased $N_{D,enh}$. Device 4 suffers from larger dynamic avalanche, as shown from the larger bending trend of the curves under hard switching conditions.

JP 2010 232627 A concerns a method for creating a trench IGBT. First a trench is etched into a substrate, which is then filled with an Arsenic epitaxial layer as n dopant. A heat treatment is performed, thereby creating a diffused epitaxial layer, which has a constant doping concentration along the lateral sides of the trench in depth direction. Afterwards the trench depth is increased and Boron is implanted and diffused at the deepened trench bottom.

US 2011/233728 A1 describes a manufacturing method for an IGBT, in which a trench recess is etched into a drift layer, at the trench bottom an n dopant is implanted and diffused to form a contiguous layer as one n dopant layer. The mask is removed and afterwards, a p dopant is implanted in the same trench recess and into the surface of the substrate to form a protection region at the trench bottom, which is embedded in the enhancement layer, and a p base layer. This method seeks to avoid an n background doping in the area between two trenches. By having a pure base layer without any high N doping concentration as background doping, the threshold voltage is improved.

US 2014/264564 A1 concerns a SiC semiconductor device, in which a trench gate electrode is completely embedded into an epitaxial n doped enhancement layer. A p doped protection layer between the trench bottom and the enhancement layer protects the trench bottom. Another contiguous, epitaxial enhancement layer of the same doping concentration as the enhancement layer surrounding the trench gate electrode separates a p base layer from the drift layer. A contiguous n doped source layer provides a direct electrical path via the n doped enhancement layer at the trench gate and the contiguous enhancement layer to the drift layer so that no MOS channel is formable at the trench gate electrode. Furthermore, the contiguous n source layer covers the whole contact area to the emitter electrode and thereby, prevents the p base layer to contact the emitter electrode. Thus, such a semiconductor device provides no MOS or IGBT functionality. Due to SiC providing nearly no diffusion of dopants, the device is formed of epitaxial layers, each having uniform doping concentration.

In "Use of the p-floating shielding layer for improving electric field concentration of the recessed gate", ICICDT 2008, pp 13-16 by Hwang, S J et al a planar IGBT is shown having a planar gate electrode as active gate, which is connected to an additional recessed gate, which is protected by a p doped layer at the trench bottom.

DISCLOSURE OF INVENTION

It is an object of the invention to provide a power semiconductor device, which simultaneously has low on-state losses and high breakdown voltage, compared to prior art devices and which device is manufactured by an easy and fast manufacturing method avoiding delicate manufacturing steps.

This object is achieved by providing an inventive power semiconductor device according to claim 1.

The n doped plasma enhancement layer acts as a sort of enhancement layer and provides the benefits of plasma enhancement without the drawbacks of premature avalanche generation and hot carrier injections in the gate oxide (first insulating layer), as it could happen in a device with increased doping concentration in the enhancement layer.

The role of the p doped protection pillow is to protect the plasma enhancement layer from the incoming electric field, thereby delaying the onset of impact ionization and increasing in this way the robustness of the device.

For an inventive semiconductor device, the presence of a region with a local doping concentration minimum translates into a point where the electric field can be relaxed. In the region where the n-type doping is lower compared to the higher doped parts of the enhancement and plasma enhancement layers, an area is provided with more relaxed electric field conditions with respect to extended large areas with large doping levels.

The inventive semiconductor device is able to combine together the advantages of lower on-state, increased RBSOA and reduced risk of hot carrier injection in the gate oxide (first insulating layer). As a result of the reduced risk of hot carrier injection in the channel gate oxide at the enhancement layer/channel interface, the device reliability is improved.

Furthermore, the plasma concentration may be increased in the inventive device, which means reduced on-state losses, without the drawbacks of an enhancement layer having increased doping concentration, which means lower breakdown voltage. As shown in FIG. 15, the on state voltage $V_{CE,on}$ may be lowered by about 10% for the same breakdown voltage. As prior art device for the FIGS. 15 to 17, a trench IGBT having an enhancement layer between p base layer and drift layer has been used (i.e. no p protection pillow or additional plasma enhancement layer).

Also shown in FIG. 15, the inventive device is able to combine the advantages of an increased robustness against breakdown avalanche without any on-state loss, i.e. even with an improvement on on-state losses (i.e. lower $V_{CE,on}$) compared to prior art devices. A much more aggressive reduction of the on-state losses may also be achieved with a slight reduction of the breakdown voltage. Also in this case the avalanche breakdown mechanism still takes place at the trench bottom and not at the touchy enhancement/base layer interface, as it happens in a device with increased enhancement doping concentration. Therefore, no threshold voltage degradation takes place in the inventive device, due to absence of hot electron injection in the gate oxide region near the p-base layer area.

In FIG. 16 the turn-off energy $E_{off}$ is shown versus on state voltage $V_{CE,on}$. Additionally to reduced on-state losses, it is possible with the inventive device to reduce the turn-off energy, which means that heat generation is tremendously reduced in the device.

In FIG. 17, the collector overvoltage during turn-off of the device is shown. Also for this feature affirms the superiority of the inventive device as less overvoltage is generated.

Furthermore, the inventive device can be manufactured without adding delicate manufacturing steps. It is a simple, cheap and fast manufacturing method, because the newly introduced protection pillow and plasma enhancement layer use the trench opening as the same mask for both layers.

BRIEF DESCRIPTION OF DRAWINGS

The subject matter of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 1:
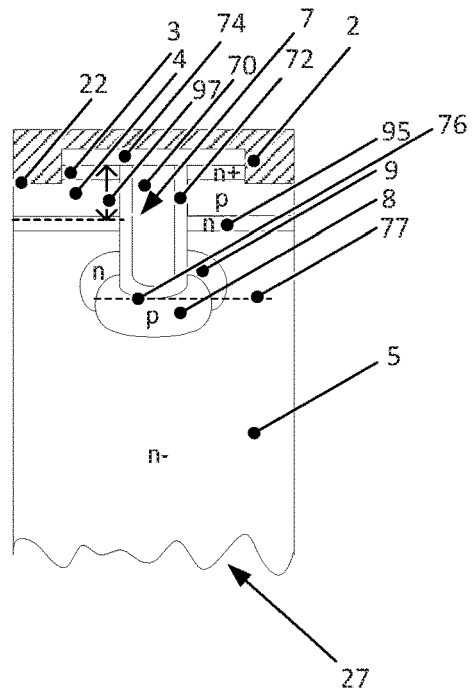
FIG. 1 shows a structure on an emitter side of an inventive insulated gate semiconductor device with a p doped protection pillow on the bottom of a trench gate electrode, an n doped enhancement layer and an n doped plasma enhancement layer on an edge between the protection pillow and the trench gate electrode.

In FIG. 1 a structure on an emitter side 22 for an inventive insulated gate power semiconductor device is shown. The device comprises an emitter electrode 2 on an emitter side 22 and a collector electrode 25 on a collector side 27, which collector side 27 is arranged opposite to the emitter side 22. An (n−) doped drift layer 5 is arranged between the emitter side 22 and the collector side 27. A p doped base layer 4 is arranged between the drift layer 5 and the emitter side 22. The base layer 4 contacts the emitter electrode 2. An n doped source layer 3 having higher doping concentration than the drift layer is also arranged on the emitter side 22. The source layer 3, which is separated from the drift layer 5 by the base layer 4, contacts the emitter electrode 2. The source layer 3 may be arranged such that the source layer 3 is arranged at both sides of each gate electrode 7, 7'.

The doping concentration of the base layer 4 and the drift layer 5 can be freely chosen due to the application needs and the rules for the doping concentrations given above. Exemplarily, the drift layer 5 has a constantly low doping concentration (low compared to the doping concentration exemplarily of the other layers like the enhancement layer 95 or the plasma enhancement layer 9). Therein, the substantially constant doping concentration of the drift layer 5 means that the doping concentration is substantially homogeneous throughout the drift layer 5, however without excluding that fluctuations in the doping concentration within the drift layer 5 being in the order of a factor of one to five may be possibly present due to manufacturing reasons. The final drift layer thickness and doping concentration is chosen due to the application needs. For devices below 600 V the doping concentration of the drift layer is exemplarily below $5*10^{14}$ cm$^{-3}$. For power devices (voltage above 600 V) an exemplary doping concentration of the drift layer 5 is between $1*10^{12}$ cm$^{-3}$ and $5*10^{14}$ cm$^{-3}$.

The doping concentration of the source layer 3 is higher than of the base layer 4 and higher than of the drift layer 5. Exemplary doping concentration of the source layer 3 is higher than $1*10^{18}$ cm$^{-3}$ and smaller than $1*10^{21}$ cm$^{-3}$, exemplarily between $1*10^{19}$ cm$^{-3}$ and $1*10^{20}$ cm$^{-3}$.

The structures as described above form an active cell. The inventive device may comprise only one active cell as disclosed above, but it is also possible that the device comprises at least two or more such active cells, i.e. the active cells can be repetitively arranged in one substrate as described for the following figures.

The gate electrode 7, 7' may have different design like a stripe design, i.e. having in a plane parallel to the emitter side 22 a short side and a long side perpendicular to the short side. The source layers 3 are arranged along the long sides of the gate electrode 7, 7'. Other designs for the trench gate electrode 7 are also possible like square design, circular design, ring design, hexagonal design, etc. The device may have one trench gate electrode 7, 7' or it may comprise a plurality of gate electrodes 7, 7' (i.e. two or more). Exemplarily, in the latter case the gate electrodes 7, 7' are arranged in a regular geometrical design.

Each inventive device comprises at least one trench gate electrode 7, 7', which has an electrically conductive gate layer 70 and a first electrically insulating layer 72, which surrounds and thus separates the gate layer 70 from the drift layer 5, the base layer 4 and the source layer 3. Exemplarily, a second insulating layer 74 is arranged between the gate layer 70 and the emitter electrode 2 and insulates these electrodes 70, 2 from each other. The trench gate electrode 7, 7' extends form the emitter side 22 down to the drift layer 5. It is arranged lateral to the base layer 4 in a plane parallel to the emitter side 22. The trench gate electrode 7, 7' has a trench bottom 76 on such side of the trench gate electrode 7, 7', which lies opposite to the emitter side 22, and trench lateral sides 75, which extend from the trench bottom 76 to the emitter side 22, exemplarily perpendicular to the emitter side 22. The trench gate electrode 7, 7' extends from the emitter side 22 up to a trench depth 77. In an exemplary embodiment, the trench depth 77 is between 5 to 9 μm deep, exemplarily between 6 to 8 μm.

An n doped enhancement layer 95 having higher doping concentration than the drift layer 5 is arranged below the p doped base layer 4 such that the enhancement layer 95 separates the base layer 4 from the drift layer 5. The enhancement layer 95 may have a maximum doping concentration, which is lower than $3*10^{16}$ cm$^{-3}$, or lower than $2.5*10^{16}$ cm$^{-3}$ or lower than $2*10^{16}$ cm$^{-3}$. The enhancement layer 95 has a maximum enhancement layer doping concentration in an enhancement layer depth 97. The enhancement layer depth 97 shall be measured from the emitter side 22, which shall be such outermost plane, at which a semiconductor layer (i.e. a doped layer) is arranged, i.e. in case of the n source layer 3 projecting above the base layer 4, it shall be the surface of the source layer 3 (i.e. the side towards the emitter electrode 2).

Depending on the manufacturing process, the doping concentration of the enhancement layer may be constant in depth direction (e.g. in case of an epitaxially grown layer) or the enhancement layer 95 may have a maximum doping concentration close to the base layer 4, which decreases towards the collector side 27 to lower doping concentrations down to the doping concentration of the drift layer 5. The maximum enhancement layer doping concentration may be at least 20 times the (maximum) doping concentration of the drift layer 5.

The enhancement layer 95 may have a thickness (which shall be the extension of the enhancement layer 95 in a direction perpendicular to the emitter side 22) of less than 3 μm or of less than 2 μm or of less than 1.5 μm.

At the trench bottom 76, a p doped protection layer in form of a protection pillow 8 is arranged such that it covers the trench bottom 76. That means that the trench bottom 76 is separated from the drift layer 5 by the protection pillow 8. Also the edges between the trench bottom 76 and the trench lateral sides 75 may be covered by the protection pillow 8. The protection pillow 8 has a higher maximum doping concentration than the drift layer 5. The protection pillow 8 is in contact to the lowly doped drift layer 5 in depth direction, i.e. on the side opposite to such side, at which the protection pillow 8 contacts the trench gate electrode 7, 7'. A maximum doping concentration of the protection pillow 8 may be $1*10^{17}$ cm$^{-3}$.

An n doped plasma enhancement layer 9, 9' having higher doping concentration than the drift layer 5 covers an edge region between the protection pillow 8 and the trench gate electrode 7, 7'. The plasma enhancement layer has a maximum plasma enhancement layer doping concentration. An N doping concentration decreases from the maximum plasma enhancement layer doping concentration towards the enhancement layer 95 and the N doping concentration decreases from the maximum enhancement layer doping concentration towards the plasma enhancement layer 9, 9' such that the N doping concentration has a local doping concentration minimum between the enhancement layer 95 and the plasma enhancement layer 9, 9'. The enhancement layer 95 and the plasma enhancement layer 9, 9' may be distinguished from each other by the local doping concentration minimum between these layers. The layers 9, 9', 95 may be distinguished from the drift layer 5 by the low doping concentration of the drift layer 5 and the higher doping concentrations of the enhancement layer 95 and the plasma enhancement layer 9, 9'.

In the device shown in FIG. 1, the plasma enhancement layer 9 only covers the edge between the protection pillow 8 and the enhancement layer 95. The protection pillow 8 contacts the drift layer 5 below the trench bottom 76. This creates a plasma increase below the enhancement layer 95 without the disadvantages of too high doping concentration of the enhancement layer 95.

The maximum enhancement layer doping concentration may be the same as the maximum plasma enhancement layer doping concentration. In another embodiment, the maximum enhancement layer doping concentration is higher than the maximum plasma enhancement layer doping concentration. It may be higher by a factor of 2 or even 2.5 more. Alternatively, it is possible to have a plasma enhancement layer 9, 9' with higher maximum doping concentration than the enhancement layer 95.

Figure 3:
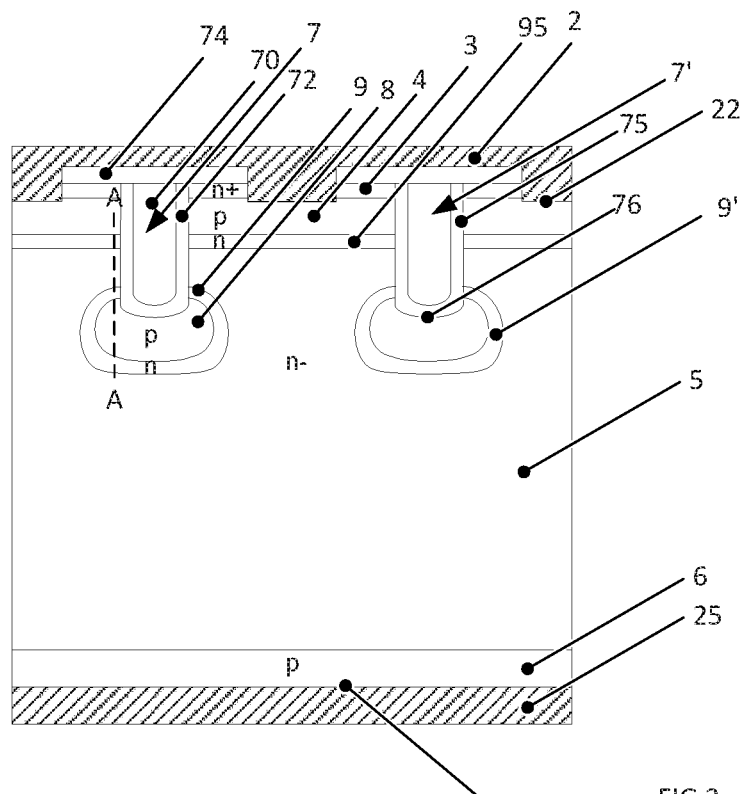
FIG. 3 shows an inventive non punch-through IGBT with a plasma enhancement layer separating the protection pillow from the drift layer.
Figure 14:
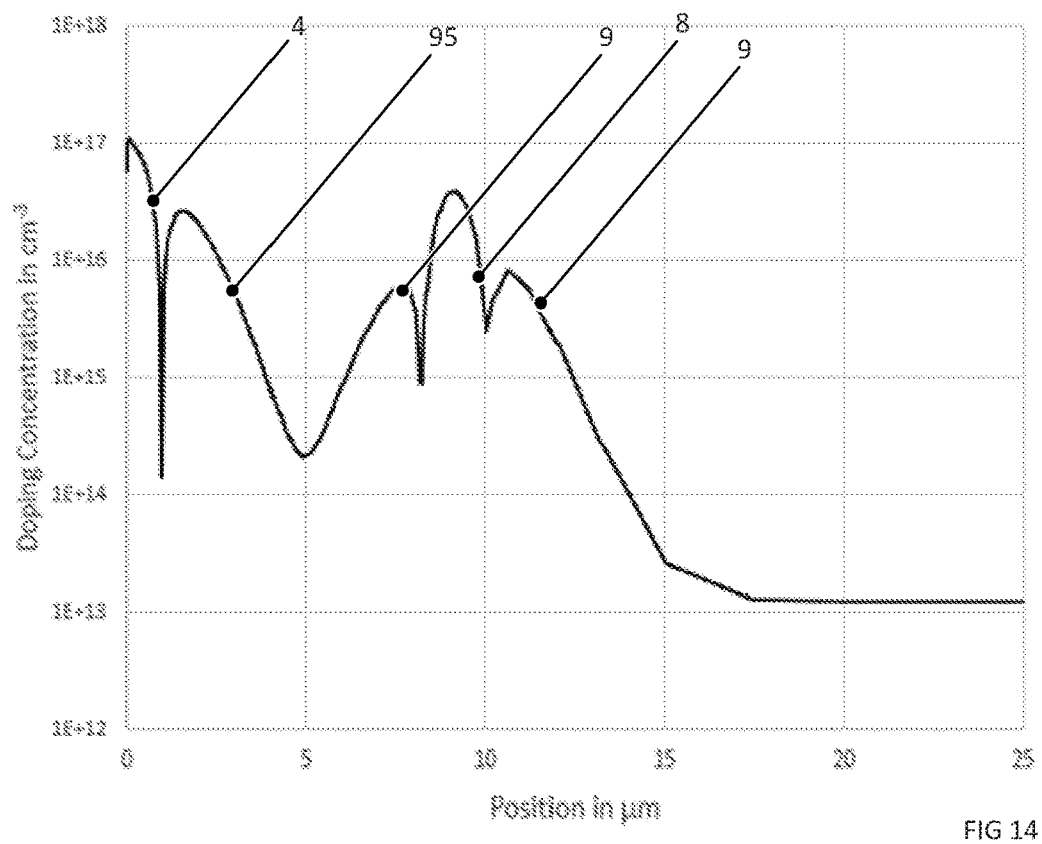
FIG. 14 shows the doping concentration profile of an inventive device along the line A-A of FIG. 3.
Figure 15:
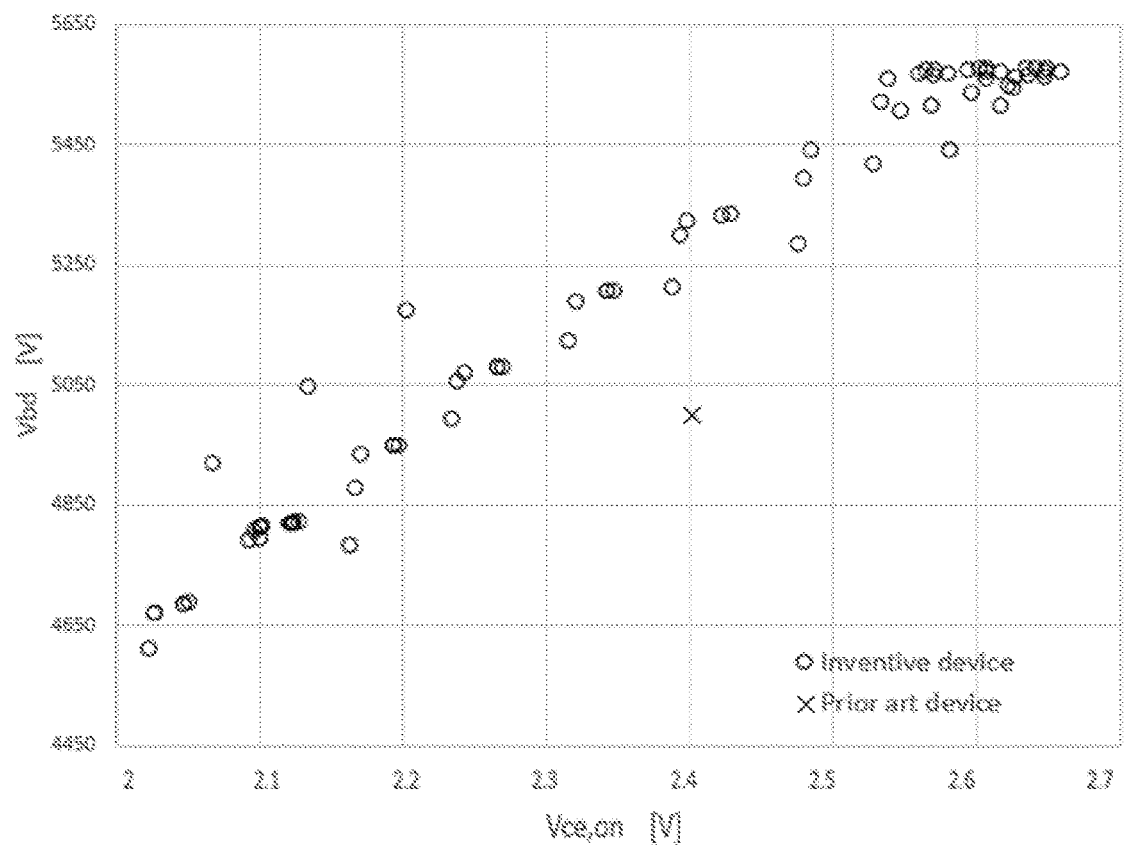
FIG. 15 shows the breakdown voltage $V_{bd}$ versus Collector Emitter Saturation Voltage $V_{ce,on}$ for an inventive IGBT and a prior art IGBT.
Figure 16:
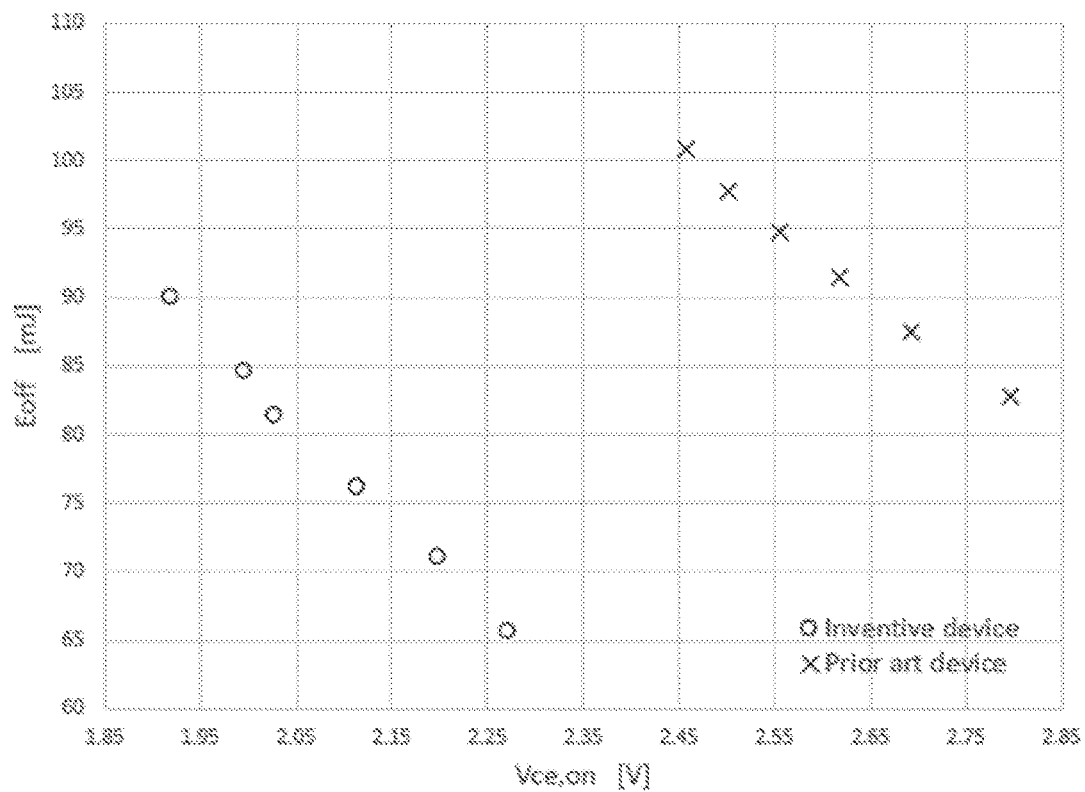
FIG. 16 shows the turn-off energy $E_{off}$ versus $V_{ce,on}$ for an inventive IGBT and a prior art IGBT.
Figure 17:
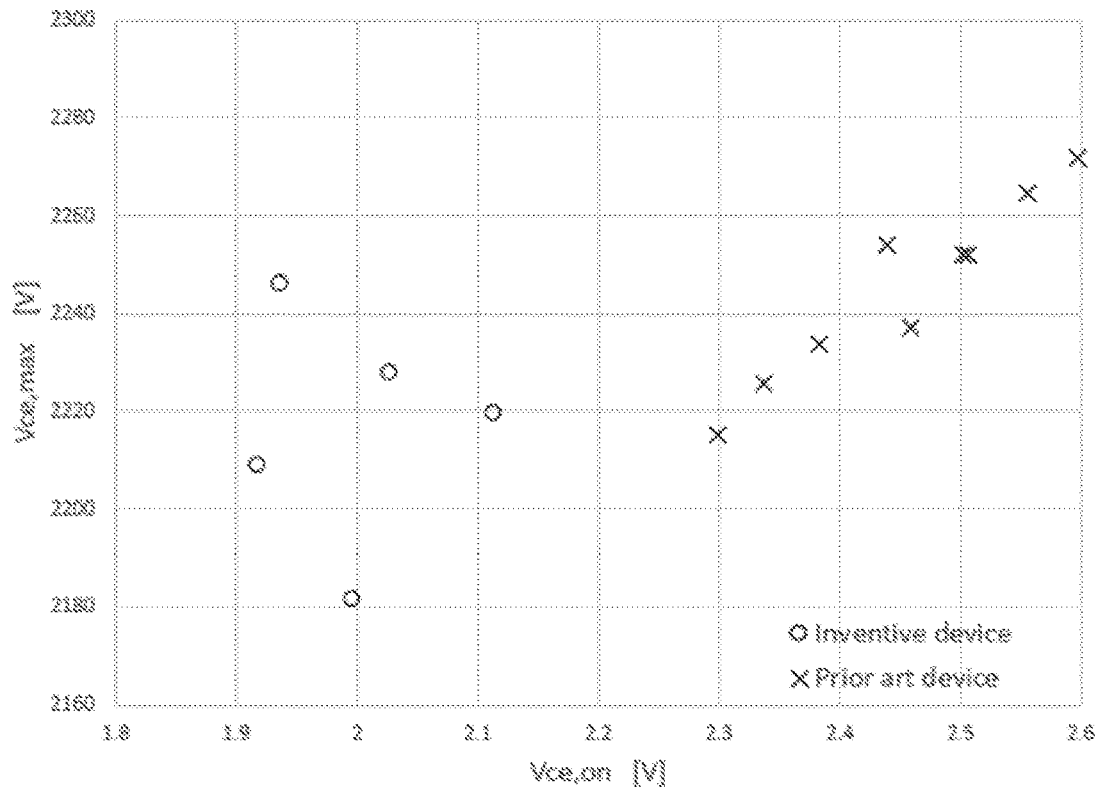
FIG. 17 shows the maximum collector-emitter overvoltage $V_{ce,max}$ versus $V_{ce,on}$ during turn-off switching condition for an inventive IGBT and a prior art IGBT.
Figure 18:
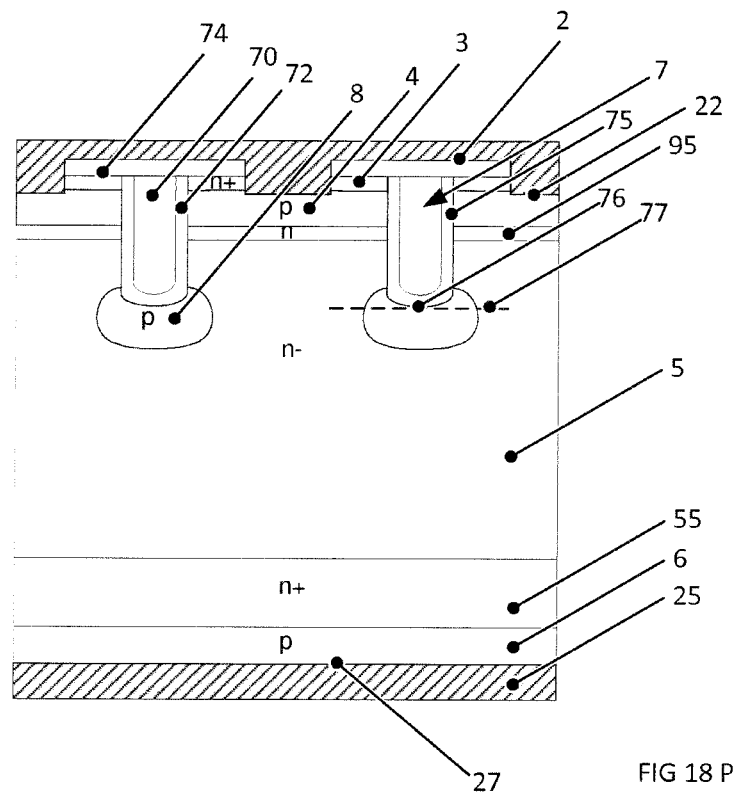
FIG. 18 shows a prior art insulated gate semiconductor device with a trench gate electrode having an enhancement layer and a protection pillow.
Figure 19:
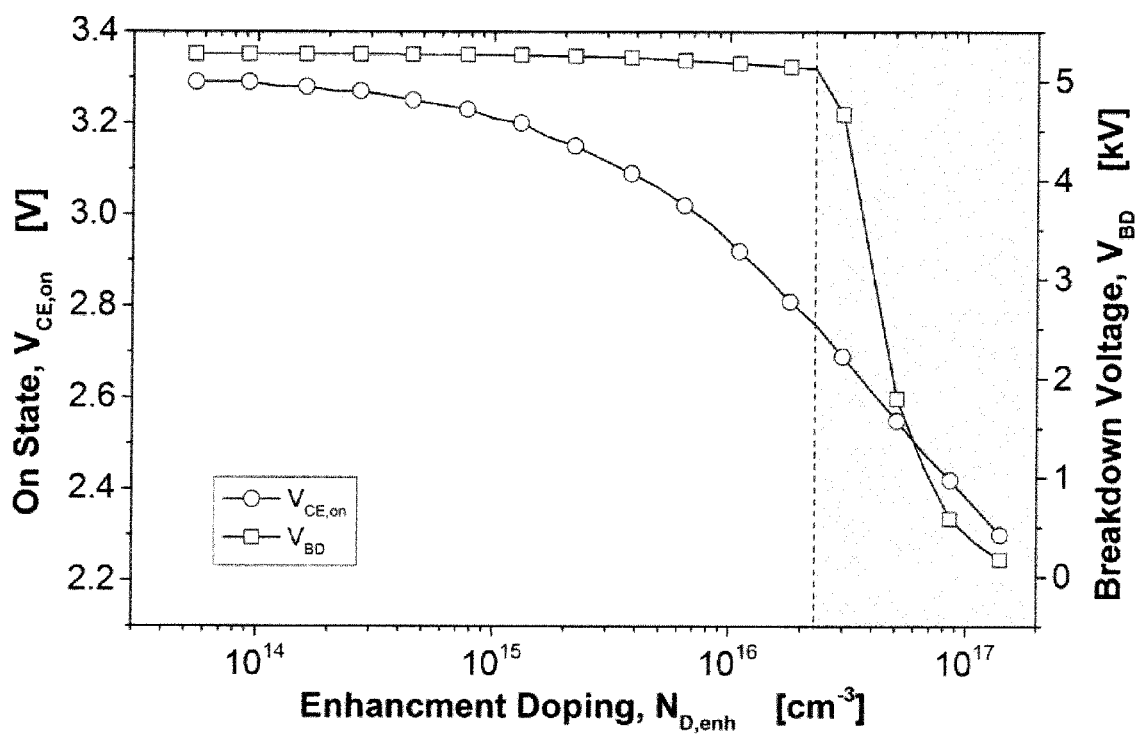
FIG. 19 shows breakdown voltage $V_{bd}$ and collector-emitter voltage $V_{CE,on}$ versus N doping concentration for prior art devices having an enhancement layer in dependence of the maximum doping concentration of the enhancement layer.
Figure 20:
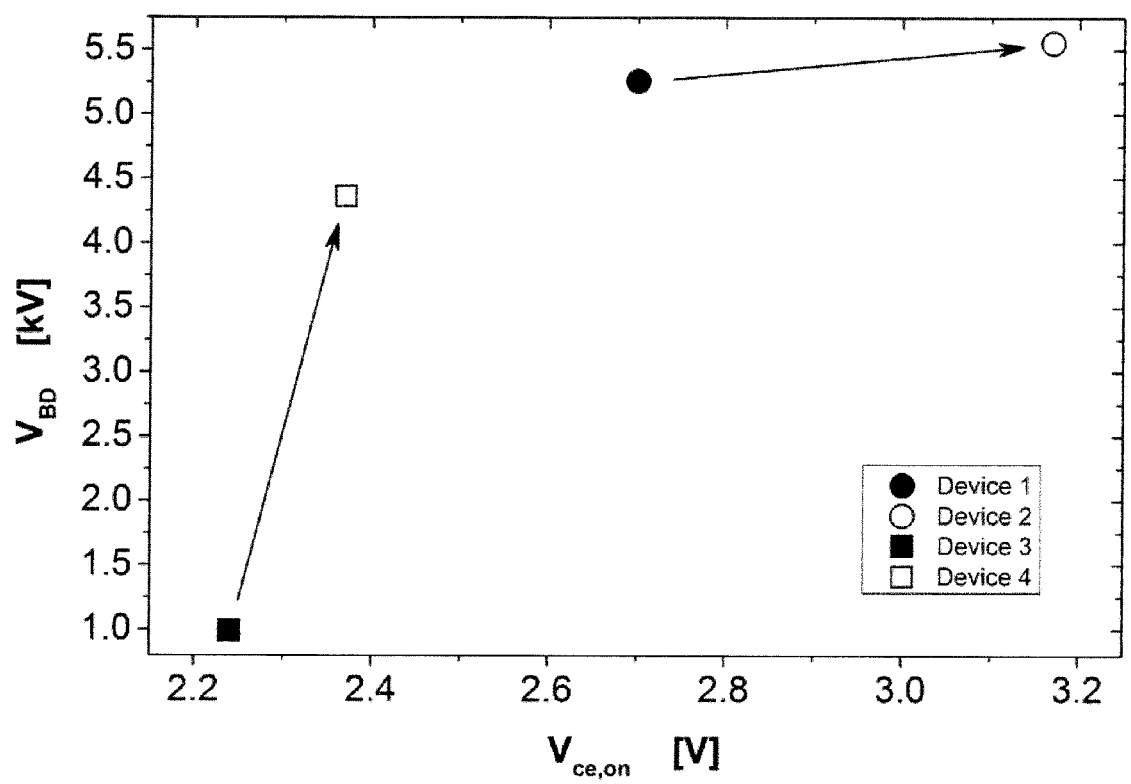
FIG. 20 shows breakdown voltage $V_{bd}$ versus the collector-emitter voltage $V_{CE,on}$ for a different prior art devices.

In FIG. 14 the doping concentrations of the layers are shown as a doping profile in depth direction (direction perpendicular to the emitter side 22) along the line A-A of FIG. 3. The line shows the net doping concentration of the donor $N_D$-$N_A$ (n doping) and the net doping concentration of the acceptor $N_A$-$N_D$.

The enhancement layer 95 and the plasma enhancement layer 9, 9' can be distinguished by a local N doping concentration minimum between the two layers. Thus, the enhancement layer 95 and the plasma enhancement layer 9, 9' can be distinguished by a local minimum in doping concentration (in depth direction) between the two layers, which N doping concentration rises from the local minimum towards the emitter side 22 to the maximum doping concentration of the enhancement layer 95 and to greater depth to the maximum doping concentration of the plasma enhancement layer 9, 9'. In an exemplary embodiment, the local doping concentration minimum is not more than half the maximum plasma enhancement layer doping concentration. The plasma enhancement layer 9, 9' has a doping concentration maximum at the junction to the protection pillow 8 (at the trench gate electrode 7, 7'). The protection pillow covers the bottom of the trench gate electrode 7, 7' such that the outer surface of the protection pillow 8 forms a boundary line to the trench gate electrode 7, 7'. At this boundary line the plasma enhancement layer 9, 9' has its doping concentration maximum.

Figure 2:
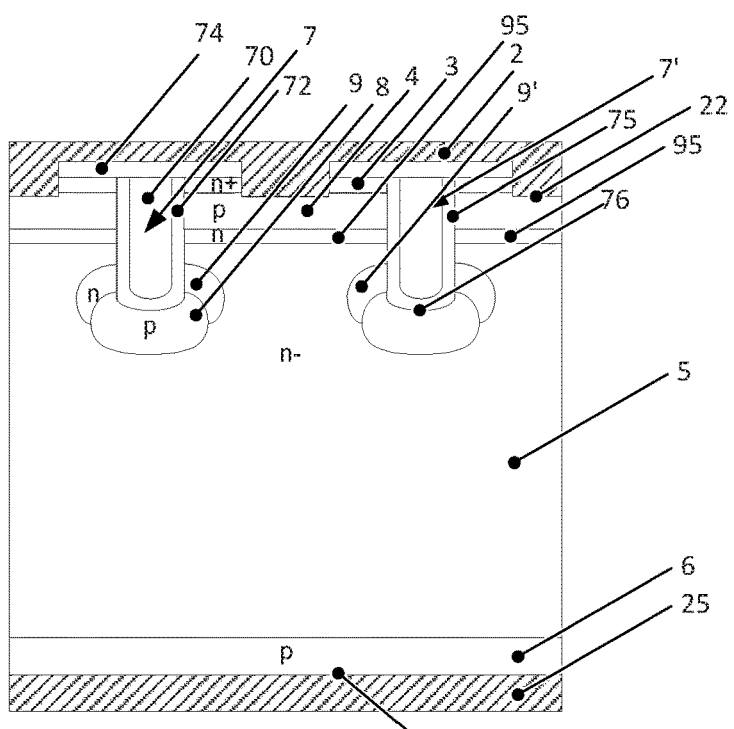
FIG. 2 shows an inventive non punch-through IGBT with the structure on the emitter side according to FIG. 1.

FIG. 2 shows the inventive structure as shown in FIG. 1, but implemented in an insulated gate bipolar transistor 1 (IGBT). In FIG. 2, two trench gate electrodes 7, 7' are shown, below each of which protection pillows 8 are arranged, which cover the trench bottom 76, and at the edge between each protection pillow 8 and trench gate electrode 7, 7' plasma enhancement layers 9, 9' are arranged. The inventive structure may of course also be applied on an IGBT having only one trench gate electrode 7 (as exemplarily shown in FIG. 1), but having additionally the collector layer 6 on the collector side 27.

In FIG. 2, each plasma enhancement layer 9, 9' covers the edge between the protection pillow 8 and the trench gate electrode 7, 7', at which the plasma enhancement layer 9, 9' is arranged. The plasma enhancement layers 9, 9' arranged at two neighboured trench gate electrodes 7, 7' and facing each other are separated from each other by the drift layer 5. That means that in a direction parallel to the emitter side 22, the N doping concentration decreases from the maximum enhancement layer doping concentration of one plasma enhancement layer 9 to the doping concentration of the drift layer 5 and rises again up the maximum enhancement layer doping concentration of the neighboured plasma enhancement layer 9', which faces the other plasma enhancement layer 9.

In FIG. 2, the IGBT 1 comprises on the collector side 27 a p doped collector layer 6, which has higher doping concentration than the drift layer 5. As well-known to the experts, such a device having the drift layer 5 arranged directly neighboured to the collector layer 6 is called a non-punch through power semiconductor device. Thus, the (n−) doped drift layer 5 is in contact to the collector layer 6 without having a highly doped layer of the first conductivity type (also called buffer layer) in between. The electric field in blocking condition for a non-punch-through device is triangular and stops within the drift layer 5. For such non punch-through devices, the space charge region does not reach the collector layer 6.

The inventive IGBT in FIG. 2 comprises a plurality of trench gate electrodes 7, 7'. Between two neighboured trench gate electrodes 7, 7', the p base layer 4 extends to a constant depth from the emitter side 22. That means the p base layer 4 forms a flat plane at the junction to the enhancement layer 95. Also the enhancement layer 95 forms a flat plane at the interface to the drift layer 5. Also the maximum enhancement layer doping concentration is located in the same depth over a whole area between two neighboured trench gate electrodes 7, 7', i.e. the doping profile in a direction perpendicular to the emitter side 22 shall be the same over the whole area of the enhancement layer 95 between two trench gate electrodes 7, 7'. Thus, a local maximum doping concentration for each enhancement layer doping concentration profile is located in the same depth over a whole area between two neighboured trench gate electrodes 7, 7'. For a diffused enhancement layer 95, the maximum enhancement layer doping concentration is located close to the junction to the base layer 4 and in a constant distance to the pn junction to the base layer 4.

In FIG. 3 an inventive IGBT is shown, which distinguishes from the device shown in FIG. 2 by the plasma enhancement layer 9, 9' surrounding the protection pillow 8 such that the protection pillow 8 is separated from the drift layer 5. Thus, the plasma enhancement layer 9, 9' at one trench gate electrode 7, 7' is a continuous layer covering the protection pillow 8. No part of the p doped protection pillow 8 is in direct contact to the low doped drift layer 5.

Figure 4:
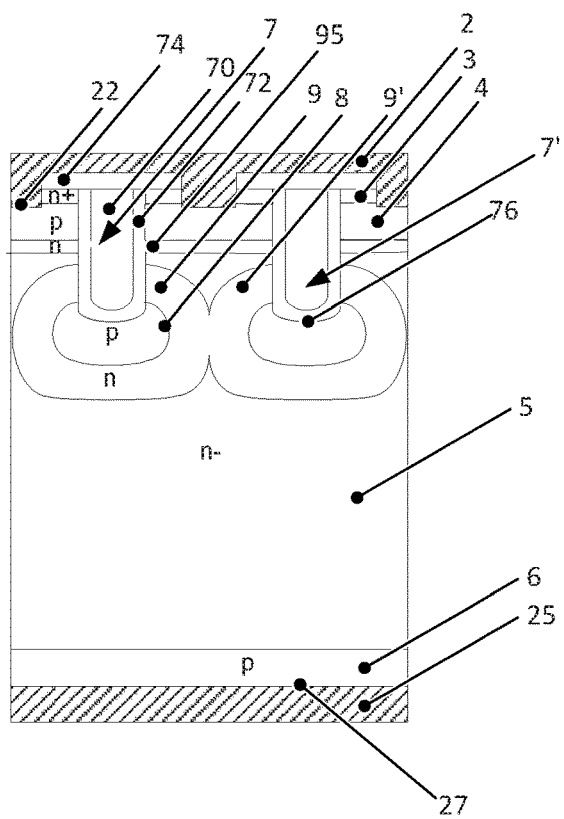
FIG. 4 shows an inventive non punch-through IGBT according to FIG. 3, wherein two neighboured plasma enhancement layer are in contact to each other.

In FIG. 4, an IGBT is shown having a plurality of trench gate electrodes 7, 7' (two are shown in the figure) and a plurality of protection pillows 8 and plasma enhancement layers 9, 9', as already been described for FIG. 2. Each plasma enhancement layer 9, 9' covers the edge between the protection pillow 8 and the trench gate electrode 7, 7', at which the plasma enhancement layer 9, 9' is arranged. The plasma enhancement layers 9, 9° arranged at two neighboured trench gate electrodes 7, 7' and facing each other are connected to each other. That means that in a direction parallel to the emitter side 22, the N doping concentration decreases from the maximum enhancement layer doping concentration of one plasma enhancement layer 9 to a doping concentration higher than the doping concentration of the drift 5 and rises again up the maximum enhancement layer doping concentration of the neighboured plasma enhancement layer 9', which faces the other plasma enhancement layer 9. Thus, the two neighboured plasma enhancement layers 9, 9' overlap such that the doping concentration of the plasma enhancement layers 9, 9' in a direction parallel to the emitter side 22 drops to a local minimum doping concentration (which for overlapping plasma enhancement layers 9, 9' is still higher than the doping concentration of the drift layer 5), wherein the local minimum doping concentration lies at the midpoint between the two neighboured trench gate electrodes 7, 7'.

Such connected plasma enhancement layers 9, 9' may be formed by farer diffusing the N dopant around the protection pillow 8 and/or by reducing the distance of the two neighboured trench gate electrodes 7, 7', i.e. by miniaturizing the cell sizes.

Figure 5:
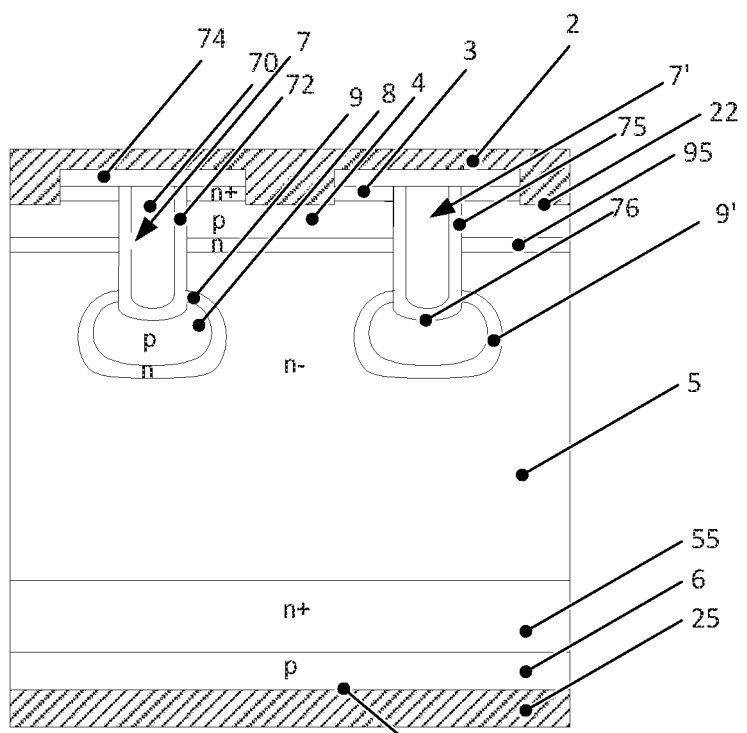
FIG. 5 shows an inventive punch-through IGBT with a plasma enhancement layer separating the protection pillow from the drift layer.

In FIG. 5 an IGBT is shown, which additionally to the device shown in FIG. 3 comprises a buffer layer 55 having a higher doping concentration than the drift layer 6, which is arranged on the drift layer 5 towards the collector side 27. A device comprising such a buffer layer 55 (which buffer layer 55 has higher doping concentration than the constantly low-doped drift layer 5, either constantly high doped, gradually rising doping concentration or with steadily, continuously increasing doping concentration towards the collector side 27) is called a punch-through IGBT. At higher blocking voltages the electric field at the border between the drift layer 5 and buffer layer 55 will not have reached zero. Along a short distance in the buffer layer 55 it is then steeply decreased to zero due to the high doping concentration.

Figure 6:
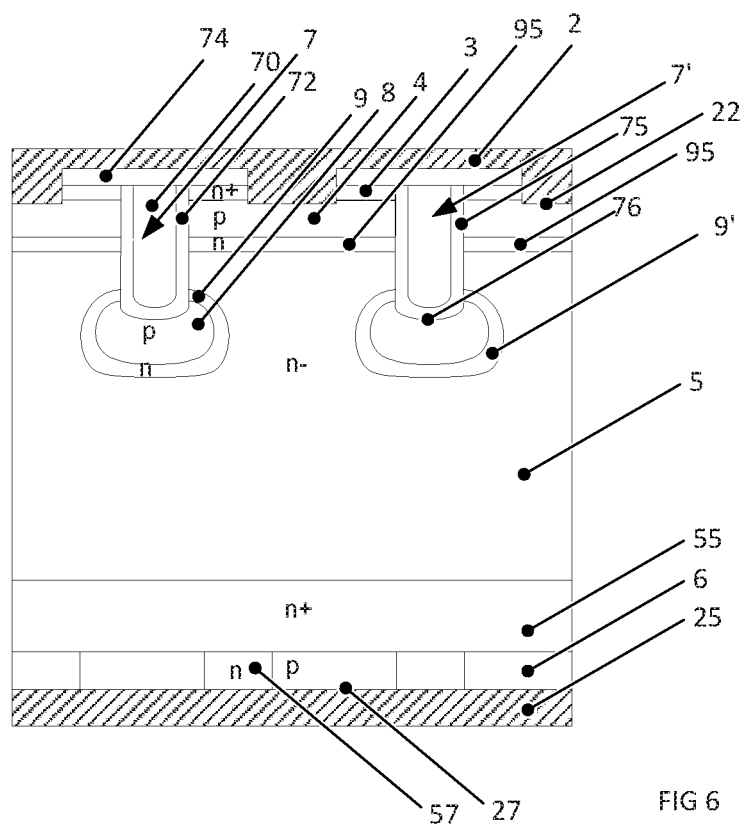
FIG. 6 shows an inventive reverse-conducting IGBT with a plasma enhancement layer separating the protection pillow from the drift layer.

The inventive structure with protection pillow structure 8, plasma enhancement layer 9, 9' and enhancement layer 95 can be integrated into all kinds of IGBT variants like a reverse conducting IGBT (FIG. 6), in which on the collector side 27 the collector layer 6 is placed and in the same plane lateral to the collector layer 6 an n doped layer 57 is arranged. Thus, the n doped layer 57 alternates with the collector layer 6. Such devices are well-known to the experts in the field. The collector layer 6 and the n doped layer 57 may comprise a plurality of p and n regions, which alternate with each other.

Figure 7:
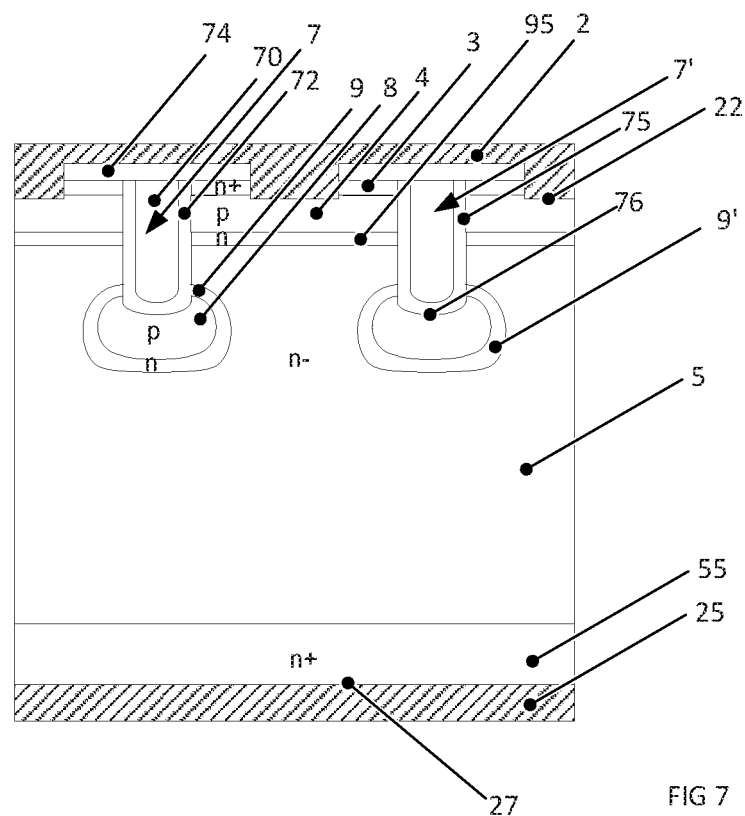
FIG. 7 shows an inventive MOSFET with a plasma enhancement layer separating the protection pillow from the drift layer.

In another embodiment, the inventive structure may be integrated in a MOSFET (metal-oxide-semiconductor field-effect transistor). In an inventive MOSFET, an n doped layer 55 (which may also be called drain layer for the MOSFET) adjoins the collector electrode 25 (FIG. 7).

For all inventive devices, the first and second insulating layers 72, 74 may be made of an insulating material, wherein also a dielectric like a metal oxide, exemplarily Silicon dioxide, shall be considered as an insulating layer. The covering second insulating layer 74 can also be made as a stack of different insulating layers. In case of the insulating layer being a metal oxide layer the channel described above is called a MOS channel (metal oxide semiconductor), whereas otherwise (insulating layers 72, 74 being made of another insulating material) the channel may also be called MIS channel (metal insulator semiconductor). As a material for the gate layer 70 any appropriate electrically conductive material like a metal or polysilicon may be used. For the purpose of this patent application, also MISFETs shall be understood as being MOSFETs, which thus shall be interpreted as the general term for MOSFETs and MISFETs.

The MOS channel is formable from the source layer 3 via the base layer 4 to the drift layer 5 along the lateral sides of the trench gate electrode 7, 7'. The base layer 4 does and must extend to the insulating layer 72 of the trench gate electrode at the lateral sides in order for a channel to be formable. At switching on the device a gate voltage is applied, by which the base layer forms an inversion layer along the lateral sides of the trench gate electrode. The trench gate electrode 7, 7' is the active gate, at which a MOS channel is formable during switch on.

For manufacturing an inventive insulated gate power semiconductor device the following steps are performed for the creation of layers on the emitter side 22.

Figure 8:
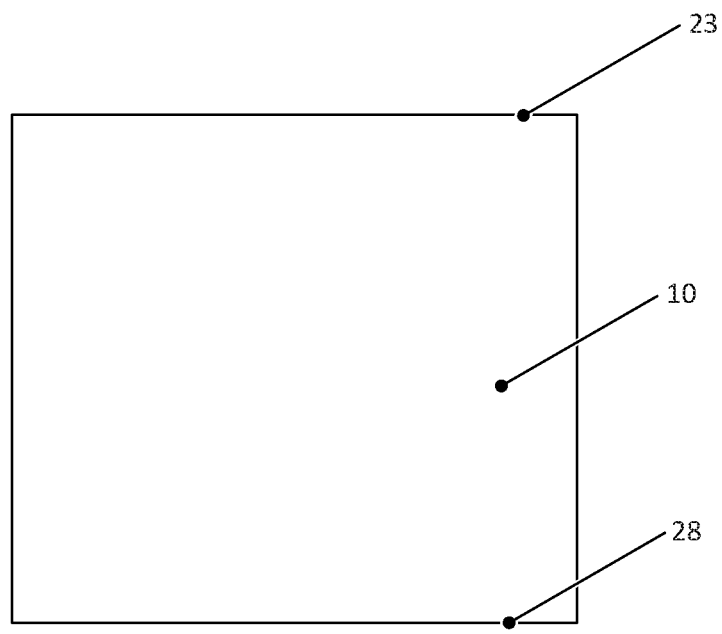
FIGS. 8 to 13 shows different manufacturing steps for the manufacturing method of an inventive device.

In step (a) an (n−) doped substrate 10 having a first and second side 23, 28 opposite to the first side 23 is provided (FIG. 8). The substrate 10 may be made on a basis of silicon. Such part of substrate having unamended doping concentration in the finalized device forms a drift layer 5. The first side 23 forms the emitter side 22 in the finalized device and the second side 28 forms the collector side 27.

In a step (b), an n doped enhancement layer 95 is formed, which separates the base layer 4 from the drift layer 5 in the finalized device. For forming the enhancement layer 95, an n dopant is applied on the first side 23. The n dopant is diffused into the substrate 10. The enhancement layer 95 may be formed before forming the base layer 4, or it may also be formed simultaneously with or later than the base layer 4 (e.g. by using an n dopant which diffuses faster than the p dopant). Exemplarily, the enhancement layer 95 is formed as a contiguous layer. The enhancement layer 95 is arranged directly below the base layer 4 so that it separates the base layer 4 from the drift layer 5.

In step (b) also a p doped base layer 4 and an n doped source layer 3 (having higher doping concentration than the drift layer 5) is formed on the first side 23. For forming the base layer 4, a p dopant is applied on the first side 23. The p dopant is diffused into the substrate 10. Then an n type dopant is implanted into the substrate 10 on the first side 23 and annealed for the creation of the source layer 3. Afterwards, an etch step may be performed, by which in a central region between two gate electrodes 7, material is removed to a depth, in which the p dopant of the base layer 4 predominates to enable a contact from the emitter electrode 2 to the base layer 4.

This step may be performed after the steps (d), (e), (h) and (i), i.e. after having created the protection pillow 8 and the plasma enhancement layer 9, 9', but it is also possible to create the base, source and enhancement layer 4, 3, 95 at any other appropriate manufacturing step, e.g. before creating the recess in step (c). Exemplarily, the source layer 3 is created after the base layer 4.

In the manufacturing method steps shown in the following figures, none of the source, base and enhancement layers 3, 4, 95 are shown, but may already have been formed (as shown in the FIGS. 1 to 7).

Figure 9:
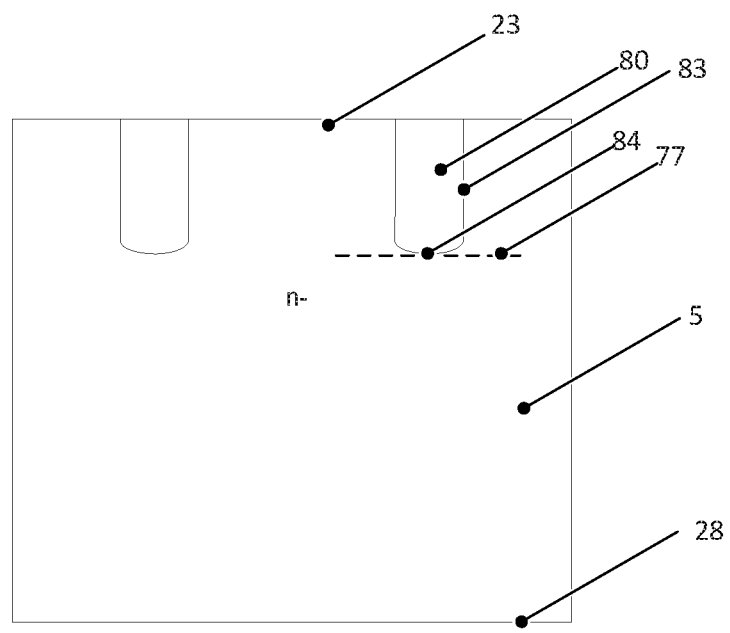

As shown in FIG. 9, in step (c) on the first side 23 a recess 80 is formed in the substrate 10 up to a recess depth, which corresponds to the trench depth 77 in the finalized device. Exemplarily, a hard mask is applied on the first side 23 and then a recess is etched through the mask to form the trench recess. An oxidation step may be performed after the etching. The recess 80 has lateral sides 83 perpendicular to the first side 23 and a recess bottom 84 parallel to the first side 23.

Figure 10:
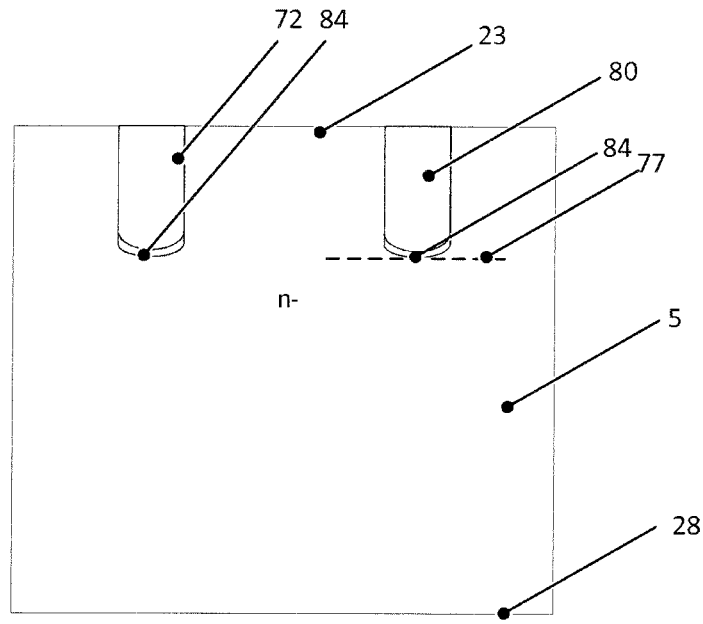

In step (h) an n dopant is implanted on the first side 23 such that an n dopant is applied at the recess bottom 84 (FIG. 10). If mask and oxide layer have been applied before, these layers prevent the dopant from entering into the semiconductor material on the first sided surface (i.e. besides the area in the recess 80). Mask and oxide layer are removed before forming an emitter electrode 2 on the first side 23.

Figure 11:
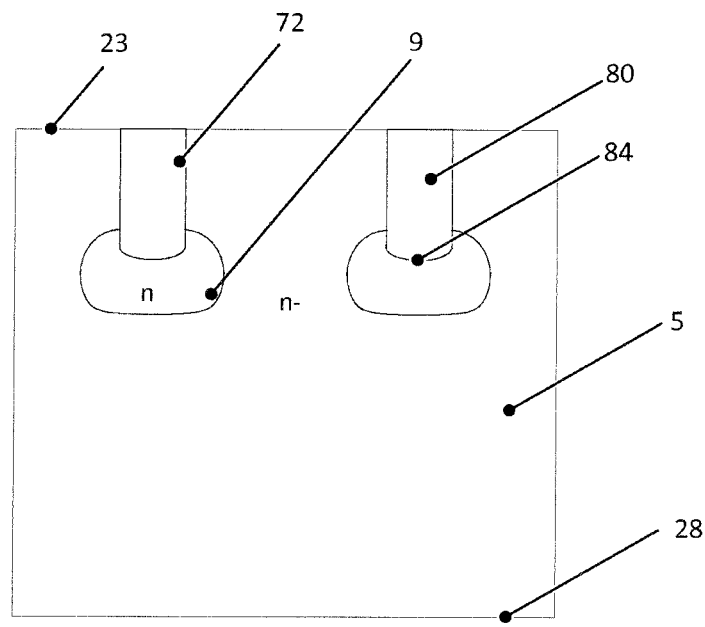

Afterwards, in step (i) for forming a plasma enhancement layer 9, 9' a heating step is performed by which the n dopant diffuses into the substrate 10 (FIG. 11). An N doping profile is created which decreases from a maximum doping concentration (at the recess bottom) towards the first side 23 (and of course also towards the second side 28 and the lateral sides).

Exemplarily, laterally from the recess 80, i.e. in planes parallel to the emitter side 22, the doping concentration of the enhancement layer 95 is exemplarily constant due to the creation of the enhancement layer 95 by applying, e.g. implanting a dopant on the emitter side 22 (constant for planes parallel to the first side 23, but decreasing for greater depths from the first side 23), whereas the plasma enhancement layer 9, 9' has a doping concentration maximum close to the junction to the protection pillow 8, which decreases to the lateral sides due to the n dopant being applied in the trench recess 80 and by the diffusion the N doping concentration, so that the N doping concentration decreases with increasing distance from the n dopant source.

Thus, the enhancement layer 95 and the plasma enhancement layer 9, 9' are formed such that the N doping concentration decreases from the maximum enhancement layer doping concentration towards the plasma enhancement layer 9, 9' and the N doping concentration decreases from the maximum plasma enhancement layer doping concentration towards the enhancement layer 95 such that the N doping concentration has a local doping concentration minimum between the enhancement layer 95 and the plasma enhancement layer 9, 9'.

Figure 12:
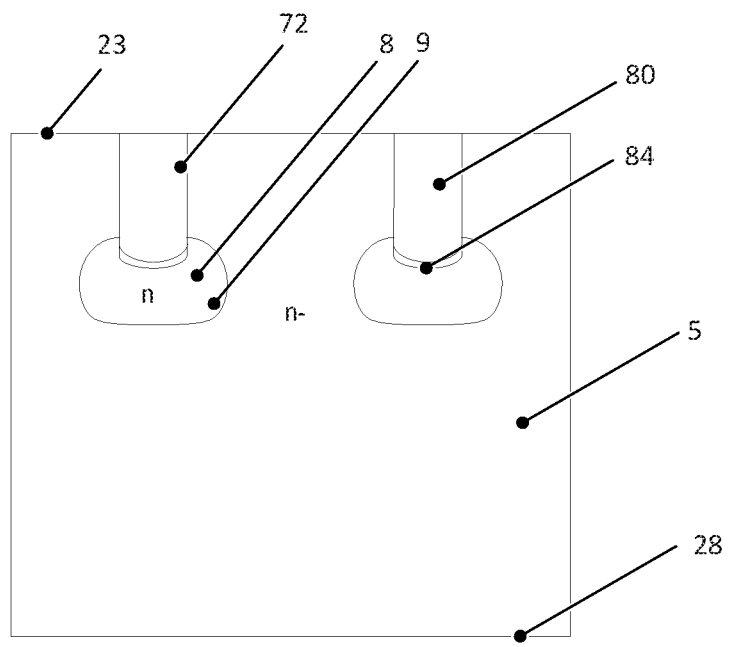

Afterwards, in step (d) a p dopant is implanted at the recess bottom 84 after step (h) and (i) (FIG. 12).

Figure 13:
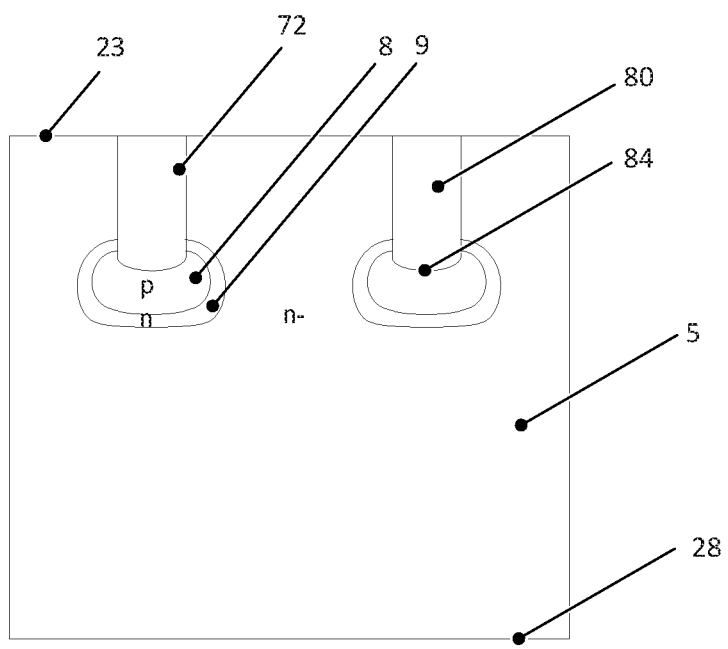

In step (e) the protection pillow 8 is formed by diffusing the p dopant such that the protection pillow 8 covers the recess bottom 84 (FIG. 13) and exemplarily also the edge of the trench between the trench bottom 76 and the trench lateral sides 75, but keeping the n dopant of the plasma enhancement layer 9, 9' at the edge region between the protection pillow 8 and the trench gate electrode 7, 7'. Covering the recess bottom 84 shall mean that the protection pillow covers the recess bottom 80 from the second side 28.

In step (f) after step (e) a first electrically insulating gate layer 72 is formed in the recess 80. The recess 80 is then filled with electrically conductive material thereby forming the gate layer 70 such that the first electrically insulating gate layer 72 separates the gate layer 70 from the drift layer 5, the base layer 4, the source layer 3, the enhancement and plasma enhancement layer 95, 9, 9'. Thus, a trench gate electrode 7, 7' is formed, which comprises the gate layer 70 and the first insulating layer 72, wherein the trench gate electrode 7 is arranged laterally to the base layer 4 in a plane parallel to the emitter side 22. The trench gate electrode 7, 7' has a trench bottom 76 and trench lateral sides 75. This step f) may be performed prior or after step (b). It is also possible to create the gate electrode only partly (i.e. forming a first insulating layer 72 (e.g. in form of an oxide layer) and afterwards performing a step for the creation of the plasma enhancement layer 9, 9' and/or protection pillow 8 (step (d)/(e) and/or (h)/(i)) and afterwards creating the gate layer 70. That means that step (f) can be splitted in two steps with another manufacturing step (step (b) and/or step (d)/(e) and/or (h)/(i)) being performed between the creation of the first insulating layer 72 and the gate layer 70.

Afterwards, in step (g) an emitter electrode 2 is formed on the first side 23, which contacts the base layer 4 and the source layer 3.

On the second side 28, for the creation of an IGBT, a p type dopant may be applied (e.g. implanted) and annealed for the creation of the collector layer 6 and optionally an n dopant is applied and annealed for the creation of a buffer layer 55. Also these steps may be performed at any appropriate manufacturing step.

For the creation of a MOSFET, an N dopant may be applied (e.g. implanted) for the creation of a drain layer 55.

Afterwards, on the second side 28 a collector electrode 25 is formed, which contacts the doped layer on the second side 28 (i.e. the collector layer for an IGBT or the drain layer for a MOSFET).

For forming the enhancement layer 95 in step (b) and the plasma enhancement layer 9, 9' in step (h) and (i), the process may be performed such that the maximum enhancement layer doping concentration is higher than the maximum plasma enhancement layer doping concentration in the finalized device (e.g. by choice of doses for the creation of the layers and/or diffusing parameters). The maximum enhancement layer doping concentration may be at least a factor of two higher than the maximum plasma enhancement layer doping concentration in the finalized device.

In another alternative embodiment, the maximum doping concentrations of the enhancement layer 8 and the plasma enhancement layer 9, 9' may be the same.

The enhancement layer 9 may be formed in step (b) and the plasma enhancement layer 9, 9' may be formed in step (h) and (i) such that the local doping concentration minimum is at most half the maximum doping concentration of the plasma enhancement layers 9, 9' in the finalized device.

The layers on the collector side 27 of the device and the trench gate electrode 7 may be made by methods well known to the experts (e.g. as described in this application in the prior art section for EP 0 795 911 A2) and finally, after all layers have been created in the substrate 10, the electrodes 2, 25 are applied as metal layers on both sides of the substrate.

These examples shall not limit the scope of the invention. The above mentioned designs and arrangements are just examples for any kinds of possible designs and arrangements for the protection pillow(s).

In another embodiment, the conductivity types are switched, i.e. all layers of the first conductivity type are p type (e.g. the drift layer 5, the source layer 3) and all layers of the second conductivity type are n type (e.g. base layer 4, the collector layer 6).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Inventive IGBT
10 substrate
2 emitter electrode
22 emitter side
23 first side
25 collector electrode
27 collector side
28 second side
3 source layer
4 base layer
5 drift layer
55 buffer layer
6 collector layer
7, 7' trench gate electrode
70 gate layer
72 first insulating layer
74 second insulating layer
75 trench lateral side
76 trench bottom
77 trench depth
8 protection pillow
80 trench recess
83 lateral sides
84 recess bottom
9, 9' plasma enhancement layer
95 enhancement layer
97 enhancement layer depth

The invention claimed is:

1. A silicon substrate-based insulated gate power semiconductor device comprising:
an emitter electrode on an emitter side and a collector electrode on a collector side, which collector side is arranged opposite to the emitter side,
a drift layer of a first conductivity type, which is arranged between the emitter side and the collector side,
a base layer of a second conductivity type, which is different from the first conductivity type, which base layer is arranged between the drift layer and the emitter side, and which base layer contacts the emitter electrode,
a source layer, which is arranged on the emitter side, and which is separated from the drift layer by the base layer and which contacts the emitter electrode,
a trench gate electrode, which comprises an electrically conductive gate layer and a first electrically insulating layer, which surrounds and thus separates the gate layer from the drift layer, the base layer and the source layer, and which trench gate electrode has a trench bottom,
a first enhancement layer of the first conductivity type having higher doping concentration than the drift layer, which separates the base layer from the drift layer, wherein the first enhancement layer has a maximum first enhancement layer doping concentration at a first enhancement layer depth,
a protection pillow of the second conductivity type, which covers the trench bottom, and
a plasma enhancement layer of the first conductivity type having higher doping concentration than the drift layer, which covers the protection pillow from the trench gate electrode to at least an outer edge of the protection pillow, and which has a maximum plasma enhancement layer doping concentration,
wherein a doping concentration of the first conductivity type increases from a local doping concentration minimum between the first enhancement layer and the plasma enhancement layer to the maximum first enhancement layer doping concentration toward the emitter side, and increases from the local doping concentration minimum to the maximum plasma enhancement layer doping concentration toward the collector side, and wherein the plasma enhancement layer has the doping concentration maximum at a junction with the protection pillow.

2. The silicon substrate-based insulated gate power semiconductor device according to claim 1, wherein the maximum first enhancement layer doping concentration is higher than the maximum plasma enhancement layer doping concentration.

3. The silicon substrate-based insulated gate power semiconductor device according to claim 2, wherein the maximum first enhancement layer doping concentration is at least a factor of two higher than the maximum plasma enhancement layer doping concentration.

4. The silicon substrate-based insulated gate power semiconductor device according to claim 1, wherein the maximum first enhancement layer doping concentration is lower than $3*10^{16}$ cm$^{-3}$.

5. The silicon substrate-based insulated gate power semiconductor device according to claim 1, wherein the local doping concentration minimum is not more than half the maximum plasma enhancement layer doping concentration.

6. The silicon substrate-based insulated gate power semiconductor device according to claim 1, wherein the first enhancement layer has a thickness of less than 3 µm.

7. The silicon substrate-based insulated gate power semiconductor device according to claim 1, wherein the plasma enhancement layer surrounds the protection pillow such that the protection pillow is separated from the drift layer.

8. The silicon substrate-based insulated gate power semiconductor device according to claim 1, wherein the plasma enhancement layer only covers an edge of the protection pillow between the protection pillow and the first enhancement layer and in that the protection pillow contacts the drift layer below the trench bottom.

9. The silicon substrate-based insulated gate power semiconductor device according to claim 1, wherein the device comprises a plurality of trench gate electrodes, wherein a local maximum doping concentration for each enhancement layer doping concentration profile is located at a same depth over a whole area between two neighboring trench gate electrodes.

10. The silicon substrate-based insulated gate power semiconductor device according to claim 1, wherein the device comprises a plurality of trench gate electrodes, and at each trench gate electrode of the plurality of trench gate electrodes a respective protection pillow, which covers a respective trench bottom, and a respective plasma enhancement layer, which covers the respective protection pillow from the respective trench gate electrode to at least the outer edge of the respective protection pillow, are arranged, wherein the plasma enhancement layers arranged at two neighboring trench gate electrodes and facing each other are separated from each other by the drift layer.

11. The silicon substrate-based insulated gate power semiconductor device according to claim 1, wherein the device comprises a plurality of trench gate electrodes, and at each trench gate electrode of the plurality of trench gate electrodes a respective protection pillow, which covers a respective trench bottom, and a respective plasma enhancement layer, the respective protection pillow from the respective trench gate electrode to at least the outer edge of the respective protection pillow, are arranged, wherein the plasma enhancement layers arranged at two neighboring trench gate electrodes and facing each other touch each other.

12. The silicon substrate-based insulated gate power semiconductor device according to claim 1, wherein the maximum first enhancement layer doping concentration is lower than $2.5*10^{16}$ cm$^{-3}$.

13. The silicon substrate-based insulated gate power semiconductor device according to claim 1, wherein the maximum first enhancement layer doping concentration is lower than $2*10^{16}$ cm$^{-3}$.

14. The silicon substrate-based insulated gate power semiconductor device according to claim 1, wherein the first enhancement layer has a thickness of less than 2 µm.

15. The silicon substrate-based insulated gate power semiconductor device according to claim 1, wherein the first enhancement layer has a thickness of less than 1.5 µm.

16. The silicon substrate-based insulated gate power semiconductor device according to claim 2, wherein the maximum first enhancement layer doping concentration is lower than $3*10^{16}$ cm$^{-3}$.

17. A method for manufacturing an insulated gate power semiconductor device, which method comprises the following steps:
(a) providing a silicon substrate of a first conductivity type having a first side and a second side opposite to the first side, a middle of the silicon substrate between the first and second sides having an unmodified doping concentration in a finalized device forming a drift layer, the first side forming an emitter side and the second side forming a collector side in the finalized device,
(b) on the first side forming a first enhancement layer of the first conductivity type, a base layer of a second conductivity type, which is different from the first conductivity type, which base layer is arranged between the drift layer and the emitter side, and a source layer of the first conductivity type, which is arranged on the emitter side and which is separated from the drift layer by the base layer,
the first enhancement layer having a higher doping concentration than the drift layer and separating the base layer from the drift layer, and the first enhancement layer having a maximum first enhancement layer doping concentration at a first enhancement layer depth,
(c) forming a trench recess in the silicon substrate up to a trench depth, which trench recess has a recess bottom,
(d) applying a dopant of the second conductivity type at the recess bottom after step (c),
(e) forming a protection pillow by diffusing the dopant of the second conductivity type such that the protection pillow covers the recess bottom,
(f) forming a first electrically insulating layer in the recess after step (e) and filling the recess with electrically conductive material thereby forming a gate layer, a trench gate electrode comprising the gate layer and the first electrically insulating layer,
(g) forming an emitter electrode on the first side, which contacts the base layer and the source layer, and a collector electrode on the second side,
(h) after step (c) and before step (d) applying a dopant of the first conductivity type at the recess bottom, and
(i) after step (h) and before step (d) forming a plasma enhancement layer by diffusing the dopant of the first conductivity type into the silicon substrate, which plasma enhancement layer has a maximum plasma enhancement layer doping concentration,
the dopant of the first conductivity type being farther diffused from the recess bottom than the dopant of the second conductivity type, such that the plasma enhancement layer covers the protection pillow from the trench gate electrode to at least an outer edge of the protection pillow, such that the maximum plasma enhancement layer doping concentration is at a junction with the protection pillow, and the first enhancement layer and the plasma enhancement layer being formed such that a doping concentration of the first conductivity type increases from a local doping concentration minimum between the first enhancement layer and the plasma enhancement layer to the maximum first enhancement layer doping concentration toward the emitter side, and increases from the local doping concentration minimum to the maximum plasma enhancement layer doping concentration toward the collector side.

18. The method according to claim 17, further comprising forming the first enhancement layer in step (b) and the plasma enhancement layer in step (h) and (i) such that the maximum first enhancement layer doping concentration is higher than the maximum plasma enhancement layer doping concentration in the finalized device.

19. The method according to claim 18, wherein the maximum first enhancement layer doping concentration is at least a factor of two higher than the maximum plasma enhancement layer doping concentration in the finalized device.

20. The method according to claim 17, further comprising forming the first enhancement layer in step (b) and the plasma enhancement layer in step (h) and (i) such that the local doping concentration minimum is at most half the maximum plasma enhancement layer doping concentration in the finalized device.

* * * * *